(12) United States Patent
Yoshimura

(10) Patent No.: US 9,107,314 B2
(45) Date of Patent: Aug. 11, 2015

(54) METHOD OF MANUFACTURING A WIRING BOARD HAVING VIA STRUCTURES

(71) Applicant: FUJITSU LIMITED, Kawasaki-shi, Kanagawa (JP)

(72) Inventor: Hideaki Yoshimura, Suzaka (JP)

(73) Assignee: FUJITSU LIMITED, Kawasaki (JP)

( * ) Notice: Subject to any disclaimer, the term of this patent is extended or adjusted under 35 U.S.C. 154(b) by 108 days.

(21) Appl. No.: 13/799,221

(22) Filed: Mar. 13, 2013

(65) Prior Publication Data

US 2013/0240259 A1    Sep. 19, 2013

(30) Foreign Application Priority Data

Mar. 16, 2012   (JP) ................................ 2012-061029

(51) Int. Cl.
*H01K 3/10* (2006.01)
*H05K 1/11* (2006.01)
*H05K 3/40* (2006.01)
*H05K 3/44* (2006.01)
(Continued)

(52) U.S. Cl.
CPC ............ *H05K 1/115* (2013.01); *G01R 31/2889* (2013.01); *H05K 3/4038* (2013.01); *H05K 3/445* (2013.01); *H05K 3/4608* (2013.01); *H05K 3/425* (2013.01); *H05K 2201/0323* (2013.01); *H05K 2201/09554* (2013.01)

(58) Field of Classification Search
CPC ... H05K 3/445; H05K 3/4038; H05K 3/4608; H05K 1/115; H05K 3/425; H05K 2201/0323; H05K 2201/09554; G01R 31/2889; Y10T 29/49155; Y10T 29/49165

USPC .................. 29/830, 831, 846, 847, 851, 852; 174/255, 260, 262, 266; 361/749
See application file for complete search history.

(56) References Cited

U.S. PATENT DOCUMENTS 7,540,082 B2 *   6/2009   Ohsumi et al. .................. 29/852
8,110,749 B2 *   2/2012   Yoshimura et al. ........... 174/260
(Continued)

FOREIGN PATENT DOCUMENTS

JP          2005-44879 A     2/2005
JP          2009-099616 A    5/2009
(Continued)

OTHER PUBLICATIONS

Korean Office Action application No. 10-2013-0028189 dated Jan. 27, 2014.

*Primary Examiner* — Donghai D Nguyen
(74) *Attorney, Agent, or Firm* — Squire Patton Boggs (US) LLP

(57) ABSTRACT

A method of manufacturing a wiring board includes: forming an outer through hole in a core substrate; filling the outer through hole with an insulation resin; forming a first conductive layer on a surface of the insulation resin at a portion where a core connecting via is formed; forming a land around the first conductive layer; laminating the wiring layer on the core substrate after the forming of the first conductive layer and the forming of the land; forming an inner through hole having a smaller diameter than that of the outer through hole and penetrating through the core substrate and the wiring layer so as to penetrate through the insulation resin; and coating a first conductive film on an inner wall surface of the inner through hole, in which the core substrate and the first conductive film are electrically connected through the first conductive layer and the land.

4 Claims, 21 Drawing Sheets

(51) Int. Cl.
*H05K 3/46* (2006.01)
*G01R 31/28* (2006.01)
*H05K 3/42* (2006.01)

(56) References Cited

U.S. PATENT DOCUMENTS

| 8,186,052 B2* | 5/2012 | Iida et al. ........................ 29/852 |
| 2007/0124929 A1 | 6/2007 | Ohsumi et al. |
| 2009/0098391 A1 | 4/2009 | Nakagawa et al. |
| 2009/0294166 A1 | 12/2009 | Yoshimura et al. |
| 2012/0241202 A1 | 9/2012 | Vasoya |

FOREIGN PATENT DOCUMENTS

| JP | 2009-290124 A | 12/2009 |
| JP | 2009-544153 A | 12/2009 |
| KR | 10-2006-0059985 A | 6/2006 |

* cited by examiner

METHOD OF MANUFACTURING A WIRING BOARD HAVING VIA STRUCTURES

CROSS-REFERENCE TO RELATED APPLICATIONS

This application is based upon and claims the benefit of priority of the prior Japanese Patent Application No. 2012-061029, filed on Mar. 16, 2012, the entire contents of which are incorporated herein by reference.

FIELD

The present disclosure relates to a method of manufacturing a wiring board, a wiring board, and a via structure.

BACKGROUND

A wiring board mounted with a semiconductor device or a test wiring board used for an examination of a semiconductor wafer or an LSI chip includes a product in which a carbon fiber-reinforced plastic (CFRP) formed by impregnating a resin material into a carbon fiber is included in a core substrate. The core substrate including the CFRP has a low thermal expansion coefficient compared to, for example, a glass epoxy substrate. Accordingly, there is a case in which the CFRP is used in the core substrate of the wiring board so that the thermal expansion coefficient of the wiring board approximates to that of a mounted semiconductor device, thereby decreasing the heat stress between the wiring board and the semiconductor device.

A probe card is widely known as a test wiring board. A semiconductor wafer or an LSI chip is disposed on a surface of the probe card so that, for example, a high-temperature operation test or a low-temperature operation testis conducted. Using the CFRP for a core substrate of the probe card, the thermal expansion coefficient of the probe card may approximate to that of the semiconductor wafer or the LSI chip. As a result, for example, the positional difference between a conductive pad of the probe card and an electrode pin of the LSI chip may be avoided.

When wiring layers are laminated on both surfaces of the core substrate, a penetrating-through hole via is formed in many cases for an interlayer connection of the wiring layers. The penetrating-through hole via is formed by forming a through-hole that penetrates through a substrate in a thickness direction and, for example, depositing a plated film on an inner wall surface of the through-hole.

In a wiring board including a conductive core substrate such as the CFRP, there is a case in which the through-hole forming the penetrating-through hole via is manufactured to have a double structure in order to avoid an electrical short between the core substrate and the penetrating-through hole via. For example, there has been a penetrating-through hole via in which a through-hole for a lower hole and an inside through-hole formed inside thereof are formed on a substrate, and a gap between the through-holes having a double structure is filled with an insulation resin.

In the meantime, there is a case in which a conductive material is used for the core substrate and the core substrate is used as a specific power supply layer including a ground layer. In this case, the penetrating-through hole via does not need to be electrically insulated from the core substrate, and may be formed with a single structure.

However, since it is desired to form the through-hole for the lower hole in the penetrating-through hole via having the double structure, a cut cross-sectional area of the carbon fiber included in the core substrate may be different from that of the penetrating-through hole via having the single structure. Accordingly, when the conductive penetrating-through holes having the single structure and the double structure are formed together on the wiring board, the physical property, such as the thermal expansion coefficient or the elastic modulus is partially different, which causes a distortion by heat stress generated in the wiring board.

In this respect, it has been suggested that all of the penetrating-through hole vias formed on the wiring board has a double via structure to decrease the heat stress generated in the wiring layer. It has also been suggested that a micro via that connects conductive patterns of a core substrate side and a wiring layer side is formed on an insulation layer disposed between the conductive patterns of the core substrate side and the wiring layer side when the core substrate serving as the power supply layer is conductively connected with the penetrating-through hole via, thereby securing a connection through the micro via.

The followings are reference documents.
[Document 1] Japanese Laid-Open Patent Publication No. 2009-290124
[Document 2] Japanese National Patent Publication No. 2009-544153
[Document 3] Japanese Laid-Open Patent Publication No. 2009-99616

However, there is a case where the insulation layer in the wiring layer is formed by hardening a prepreg obtained by impregnating an insulation resin into the fiber, such as a glass fiber. A laser may be used in order to form the micro via on the insulation layer. In this case, in order to cut the fiber included in the insulation layer, it is desired to increase the output of the laser. However, it is difficult to form a via hole that forms a micro via with a diameter of an opening or a depth of a perforation having a desired size so as to have an improved degree of precision. If the diameter of the opening or the depth of the perforation of the via hole is larger than a desired size, there is a concern that it is difficult to fill the via hole by a fill plating.

Since the surface of the insulation layer through which the via hole is perforated is covered by, for example, a copper foil in many cases, it is desired to remove the copper foil at a portion that forms the via hole by, for example, an etching process, as a pre-process of perforating the via hole. Accordingly, in a wiring board that includes a conductive core substrate and a plurality of penetrating-through hole vias, it may be considered that there is a room for improving the structure of a penetrating-through hole via ("a core connecting via") disposed while being electrically connected with the core substrate.

SUMMARY

According to an aspect of the embodiments, there is provided a method of manufacturing a wiring board including a core substrate having conductivity and a plurality of penetrating-through hole vias. The method of manufacturing the wiring board includes: forming an outer through hole penetrating through the core substrate at a portion of the core substrate at which a penetrating-through hole via is formed; filling the outer through hole with an insulation resin; forming a first conductive layer on a surface of the insulation resin at a portion at which a core connecting via electrically connected with the core substrate among the plurality of penetrating-through hole vias is formed; forming a land configured to electrically connect the core substrate and the first conductive layer around the first conductive layer; laminating a wiring layer on the core substrate after the forming of the first conductive layer and the forming of the land; forming an inner through hole that has a smaller diameter than that of the outer through hole and penetrates through the core substrate and the wiring layer so as to penetrate through the insulation resin; and coating a first conductive film on an inner wall surface of the inner through hole, in which the core substrate and the first conductive film are electrically connected through the first conductive layer and the land.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Figure 1:
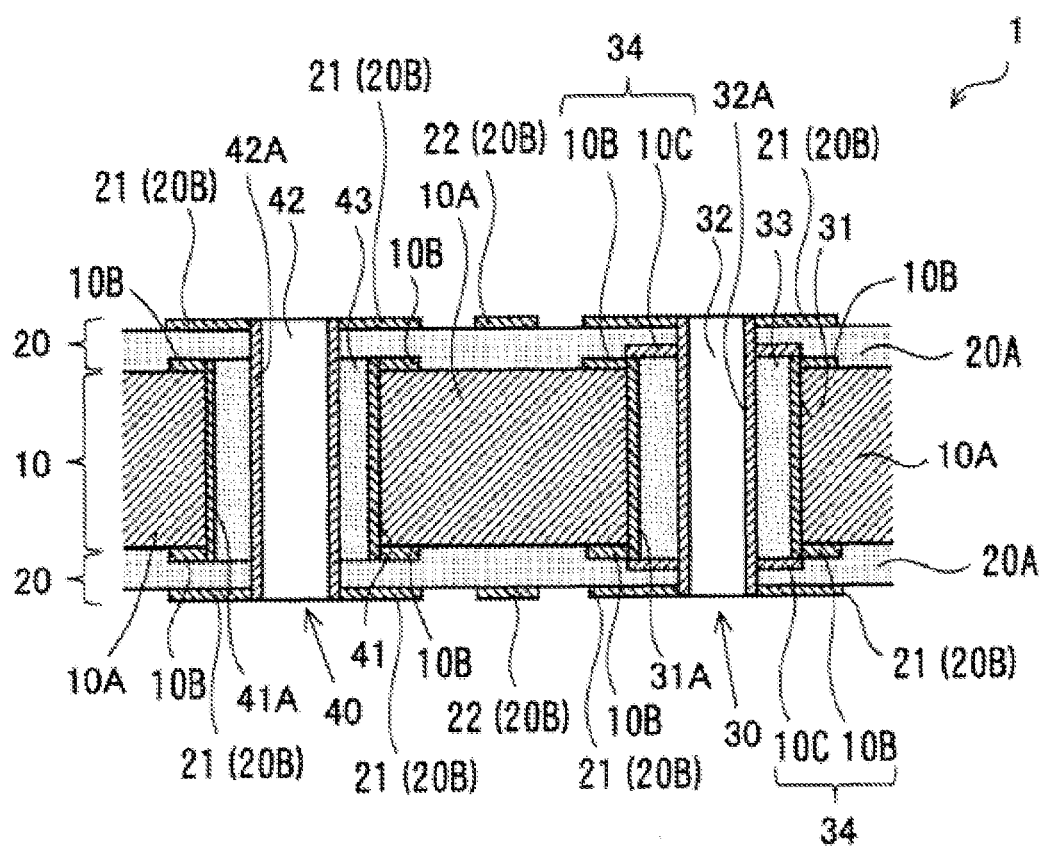
FIG. 1 is a cross-sectional view of a printed wiring board according to a first exemplary embodiment of the present disclosure.

A wiring board and a method of manufacturing the wiring board according to exemplary embodiments will be described with reference to the accompanying drawings. The configuration of exemplary embodiments described herein below is an example, and the present disclosure is not limited thereto.
[First Exemplary Embodiment]FIRST EXEMPLARY EMBODIMENT
<Printed Wiring Board>Printed Wiring Board FIG. 1 is a cross-sectional view of a printed wiring board 1 according to a first exemplary embodiment of the present disclosure. The printed wiring board 1 may be used, for example, as a substrate for a probe card used in an examination of a semiconductor wafer or an LSI chip or a wiring board on which a semiconductor device is mounted. The printed wiring board 1 includes a core substrate 10 having conductivity and a wiring layer 20 laminated on each of the upper and lower surfaces (both surfaces) of the core substrate 10.

The core substrate 10 includes a conductive layer 10A that contains a carbon fiber-reinforced plastics (CFRP) having conductivity and a conductive land 10B formed on both surfaces (upper and lower surfaces) of the conductive layer 10A. The CFRP contained in the conductive layer 10A of the core substrate 10 may be formed, for example, by heating and pressing a prepreg obtained by impregnating a thermosetting resin such as an epoxy resin into a woven cloth of a carbon fiber. The carbon fiber included in the conductive layer 10A is oriented so as to be spread in a plane direction of the conductive layer 10A.

The resin material implemented in the carbon fiber in the conductive layer 10A is not limited to the epoxy resin. For example, a resin such as polysulfone, polyethersulfone, polyphenylsulfone, polyphthalamide, polyamideimide, polyketone, polyacetal and polyimide, may be impregnated into the carbon fiber. The resin material impregnated in the carbon fiber may include an inorganic filler which may include, for example, silica powder, alumina powder, magnesium hydroxide powder, aluminum nitride powder and aluminum hydroxide powder. The thermal expansion coefficient of the core substrate 10 may be adjusted by changing the weight average particle diameter of the inorganic filler or the content of the inorganic filler in the resin material. The type of the carbon fiber is not limited to the woven cloth, but may include a non-woven cloth. For example, silica powder, alumina powder and the magnesium hydroxide powder contribute to adjusting the thermal expansion coefficient and improving the elastic modulus. The flame resistance of the conductive layer 10A may be improved by including the aluminum hydroxide powder in the resin material impregnated in the carbon fiber. Additionally, for example, calcium hydroxide powder and zinc hydroxide powder may be added to the resin material impregnated in the carbon fiber to contribute in improving the flame resistance of the conductive layer 10A similarly to the aluminum hydroxide powder.

A set of the wiring layers 20 is laminated and formed on both surfaces of the core substrate 10. The wiring layer 20 includes an insulation layer 20A and a conductive pattern layer 20B. The wiring layer 20 illustrated in FIG. 1 has a two-layered structure in which the conductive pattern layer 20B is laminated on the insulation layer 20A, but may have a lamination structure including three or more layers.

The insulation layer 20A may be formed, for example, by heating and pressing a prepreg obtained by impregnating a resin material into a glass fiber cloth. The resin material impregnated in the glass fiber cloth may be, for example, the resin material impregnated in the carbon fiber as described above.

The conductive pattern layer 20B includes a land 21 and a wiring pattern 22. The material used for the conductive pattern layer 20B may be any conductive material without a specific limitation, and, for example, a copper foil may be used. An overcoat layer (not illustrated) such as, for example, a solder resist is laminated on the wiring pattern 22. Here, a material used for the overcoat layer is any insulation material without a specific limitation, but may be, for example, an epoxy resin.

The land 21 disposed in a lower surface side of the printed wiring board 1 may be electrically connected with, for example, an electrode terminal of a probe card (not illustrated). The land 21 disposed in an upper surface side of the printed wiring board 1 may be electrically connected with, for example, a bump electrode of a semiconductor wafer. As illustrated in another exemplary embodiment to be described below, when a build-up layer is further laminated on each wiring layer 20, a wiring portion of the build-up layer and the land 21 may be electrically connected through a via.

Here, a The structure of a penetrating-through hole via in the printed wiring board 1 will be described hereinafter. A plurality of penetrating-through hole vias are provided in the printed wiring board 1 in a plane direction of the printed wiring board 1 for an interlayer connection. The core substrate 10 has conductivity as described above, and is used as a power supply layer (including a ground layer) that has a specific potential in the exemplary embodiment. The plurality of penetrating-through hole vias in the printed wiring board 1 include a core connecting via 30 electrically connected with the core substrate 10 and a core separating via 40 electrically separated (insulated from) from the core substrate 10. The printed wiring board 1 includes the core connecting via 30 and the core separating via 40 which are mixed in the plane direction thereof.

FIG. 1 illustrates one core connecting via 30 and one core separating via 40 formed in the printed wiring board 1, but the number of the core connecting via 30 and the core separating via 40 formed in the printed wiring board 1 is not limited to a specific number.

The penetrating-through hole vias including the core connecting via 30 and the core separating via 40 in the printed wiring board 1 have, so called, a double via structure (a via-in-via structure), and penetrate through the core substrate 10 and the wiring layers 20 laminated on both surfaces of the core substrate 10 in a thickness direction of the printing wiring board 1. Here, the core connecting via 30 will be described first, and thereafter, the core separating via 40 will be described.

The core connecting via 30 includes an outer through hole 31, an inner through hole 32, an insulation resin part 33, conductive films 31A and 32A and a core connecting conductive part 34.

The outer through hole 31 is a lower hole that penetrates through the core substrate 10 from an upper surface to a lower surface in the thickness direction of the core substrate 10. The inner through hole 32 is a through hole that has a smaller diameter than that of the outer through hole 31, and penetrates through the core substrate 10 and a set of the wiring layers 20 laminated on both surfaces of the core substrate 10.

The outer through hole 31 and the inner through hole 32 have, for example, a circular cross-section and are concentrically disposed. An axis center of the outer through hole 31 and the inner through hole 32 is formed, for example, along the thickness direction of the core substrate 10. However, the aforementioned shapes of the outer through hole 31 and the inner through hole 32 are examples, and for example, the outer through hole 31 and inner through hole 32 may have a cross-section having a polygonal shape or an oval shape, other than the circular shape.

The insulation resin part 33 is formed between the outer through hole 31 and the inner through hole 32, and made of an insulation resin. The conductive film 31A is a conductive material that coats an inner wall surface of the outer through hole 31, and is an example of a second conductive film. The conductive film 31A is interposed between an inner peripheral surface of the core substrate 10 and an outer peripheral surface of the insulation resin part 33. The conductive film 32A is a conductive material that coats an inner wall surface of the inner through hole 32, and is an example of a first conductive film. In the exemplary embodiment, the conductive films 31A and 32A are formed by, for example, a copper plating, but may be formed of other conductive materials.

The insulation resin part 33 is provided so as to avoid an electrical short between the conductive film 32A and the conductive layer 10A by securing an insulation between the conductive film 32A coated on the inner wall surface of the inner through hole 32 and the conductive layer 10A within the cross-section of the core substrate 10. The resin material used for the insulation resin part 33 is not limited to a specific type, but, for example, the aforementioned resin material impregnated in the carbon fiber contained in the conductive layer 10A may be used.

The core connecting conductive part 34 includes a land 10B and a lid plating unit 10C. The lid plating unit 10C is formed by, for example, a copper plating, but is not limited thereto. The lid plating unit 10C is deposited so as to coat both surfaces of the insulation resin part 33 and is connected to both of the conductive film 32A coated on the inner wall surface of the inner through hole 32 and the land 10B.

In the meantime, the land 10B is formed around the lid plating unit 10C around the outer through hole 31 in a surface of the conductive layer 10A of the core substrate 10. The land 10B is formed, for example, in a ring shape, but may be formed in another shape. The land 10B is electrically connected with the conductive layer 10A of the core substrate 10, in addition to the lid plating unit 10C. Here, the land 10B is electrically connected to the carbon fiber exposed to the surface (an upper surface or a lower surface) of the conductive layer 10A. Since the inner wall surface of the outer through hole 31 is coated with the conductive film 31A, the conductive film 31A is electrically connected with the carbon fiber exposed to the inner wall surface of the outer through hole 31. Accordingly, the electrical connection between the land 10A and the conductive layer 10A may be appropriately achieved.

As described above, in the core connecting via 30, the conductive layer 10A and the conductive film 32A formed on the inner wall surface of the outer through hole 31 of the core substrate 10 are electrically connected through the core connecting conductive part 34 including the land 10B and the lid plating unit 10C. Accordingly, in the printed wiring board 1, the conductive layer 10A of the core substrate 10 may be used as, for example, a power supply layer or a ground layer.

Next, the core separating via 40 will be described. The core separating via 40 includes an outer through hole 41, an inner through hole 42, an insulation resin part 43 and conductive films 41A and 42A.

The outer through hole 41, the inner through hole 42, the insulation resin part 43 and the conductive films 41A and 42A correspond to the outer through hole 31, the inner through hole 32, the insulation resin part 33 and the conductive films 31A and 32A of the core connecting via 30, respectively.

That is, the outer through hole 41 of the core separating via 40 is a lower hole that penetrates through the core substrate 10 in the thickness direction. The outer through hole 41 of the core separating via 40 has the same diameter as that of the outer through hole 31 of the core connecting via 30. The inner through hole 42 of the core separating via 40 is a through hole that has a smaller diameter than that of the outer through hole 41, and penetrates through the core substrate 10 and the wiring layers 20 laminated on the upper and lower surfaces of the core substrate 10. The outer through hole 41 and the inner through hole 42 are concentrically formed, and the insulation resin part 43 is formed between the outer through hole 41 and the inner through hole 42. The inner through hole 42 of the core separating via 40 may have the same diameter as that of the inner through hole 32 of the core connecting via 30.

The conductive film 41A is a conductive material coated on the inner wall surface of the outer through hole 41 and interposed between the inner peripheral surface of the core substrate 10 and an outer peripheral surface of the insulation resin part 43. The conductive film 42A is a conductive material coated on an inner wall surface of the inner through hole 42. The conductive films 41A and 42A are formed, for example, by a copper plating, but may be formed of other conductive materials. The insulation resin part 43 is provided so as to avoid an electrical short between the conductive film 42A and the conductive layer 10A by securing an insulation between the conductive film 42A coated on the inner wall surface of the inner through hole 42 and the conductive layer 10A within the cross-section of the core substrate 10. The resin material used for the insulation resin part 43 is not limited to a specific type, but, for example, the aforementioned resin material impregnated in the carbon fiber contained in the conductive layer 10A may be used.

The core separating via 40 is different from the core connecting via 30 in that the core separating via 40 does not include the core connecting conductive part 34 included in the core connecting via 30. Accordingly, the insulation is secured between the conductive film 42A formed on the inner wall surface of the inner through hole 42 of the core separating via 40 and the conductive layer 10A of the core substrate 10.

Accordingly, the conductive film 42A formed on the inner wall surface of the inner through hole 42 of the core separating via 40 may function as, for example, a via connected to the power supply layer (including the ground layer) that has a potential different from that of the conductive layer 10A or a via for a signal wiring electrically connected with a signal wiring. The conductive film 41A formed on the inner wall surface of outer through hole 41 of the core separating via 40 is electrically connected with the conductive layer 10A of the core substrate 10, thereby having the same potential as that of the conductive layer 10A. Accordingly, for example, when the conductive layer 10A of the core substrate 10 also serves as the ground layer, the conductive film 41A formed on the inner wall surface of the outer through hole 41 may function as a ground via (a via for a ground potential) connected with the ground layer.

In the printed wiring board 1, since the plurality of penetrating-through hole vias are formed in the plane direction of the printed wiring board 1, both of the core connecting via 30 and the core separating via 40 are formed with the double via structure. The outer through hole 41 of the core separating via 40 has the same diameter as the outer through hole 31 of the core connecting via 30. As a result, the cut cross-sectional areas of the carbon fibers included in the core substrate 10 may be approximated in the core separating via 40 with the core connecting via 30.

Accordingly, a partial change in the physical properties such as the thermal expansion coefficient or the elastic modulus in the plane direction of the printed wiring board 1 may be avoided. Accordingly, the thermal stress generated in the printed wiring board 1 may be decreased and the generation of a distortion may be suppressed.

In the core connecting via 30, the core connecting conductive part 34 is formed on the surface of and around the insulation resin part 33, and the core substrate 10 and the conductive film 31A are electrically connected through the core connecting conductive part 34.

Figure 10:
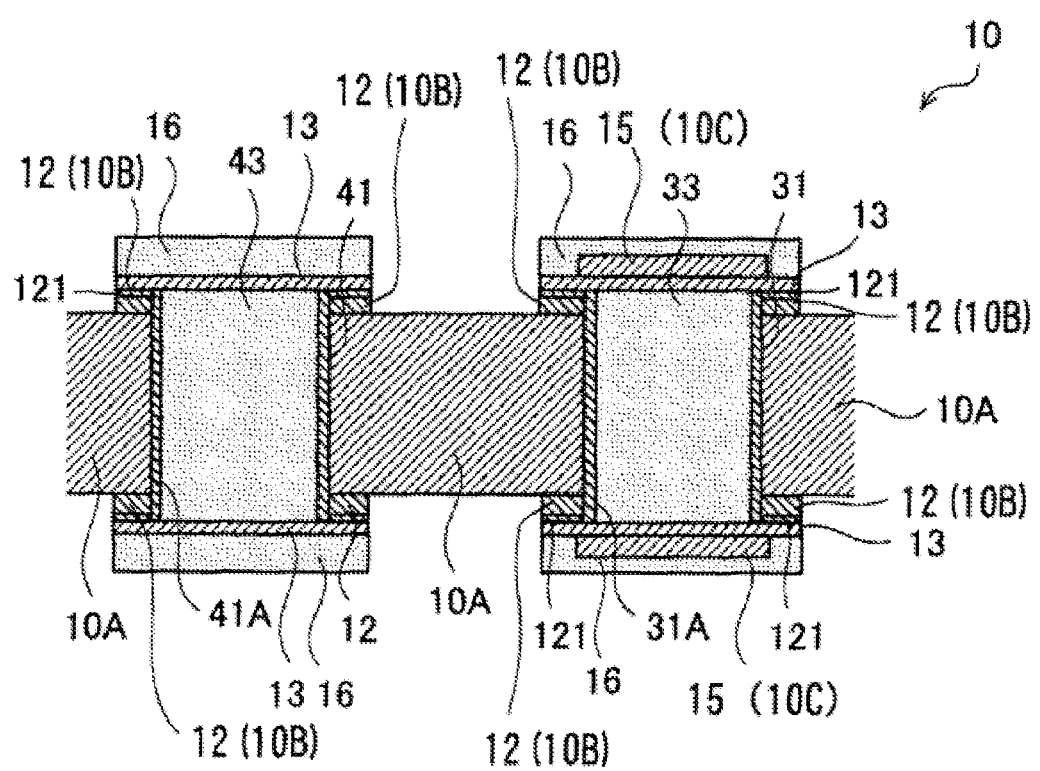
FIG. 10 is a cross-sectional view (a ninth cross-sectional view) illustrating the process of manufacturing the printed wiring board according to the first exemplary embodiment of the present disclosure.

According to the structure of the core connecting via 30 as described above, it is not necessary to separately form a micro via in order to electrically connect the core connecting via 30 and the core substrate 10, as in, for example, the wiring board as illustrated in FIG. 10 of Japanese Laid-open Patent Publication No. 2009-290124.

For example, in order to electrically connect the land 10B formed on the surface of the core substrate 10 and the conductive pattern layer 20B of the wiring layer 20, it is not necessary to separately form the micro via in the insulation layer 20A that includes the glass fiber cloth by a laser processing.

Accordingly, a good electrical connection may be achieved between the core substrate 10 and the core connecting via 30 without performing a laser processing on the insulation layer 20A where a numerical error in the diameter of the opening or the depth of the perforation is easily generated during the forming of the via hole.

Since it is not necessary to form the via hole on the insulation layer 20A using a laser, a process of removing the copper foil 24 that covers the portion at which the via hole is formed in the surface of the insulation layer 20A by etching which is performed as a pre-process before forming the via hole, is not required. Accordingly, a process of manufacturing the printed wiring board 1 becomes further simplified and easy, thereby improving the throughput.

The printed wiring board 1 according to the exemplary embodiment includes a plurality of core connecting vias 30 and a plurality of core separating vias 40 so that the outer through holes 31 and 41 may be equally disposed in the plane direction of the core substrate 10. For example, the outer through holes 31 and 41 may be disposed in a grid pattern. In this case, the outer through holes 31 and 41 may be equally disposed in the plane direction of the core substrate 10 so that the intervals of the respective vertices of a grid are the same and the positions of the vertices are matched to the axis centers of the outer through holes 31 and 41. Accordingly, the generation of irregularities in the thermal expansion coefficient in the plane direction of the printed wiring board 1 may be suppressed.

<Method of manufacturing the printed wiring board>Method of Manufacturing Printed Wiring Board Next, a method of manufacturing the printed wiring board 1 will be described. FIGS. 2 to 17 are cross-sectional views illustrating a process of manufacturing the printed wiring board 1 according to the first exemplary embodiment.

<Core substrate manufacturing process>Core Substrate Manufacturing Process

Figure 2:
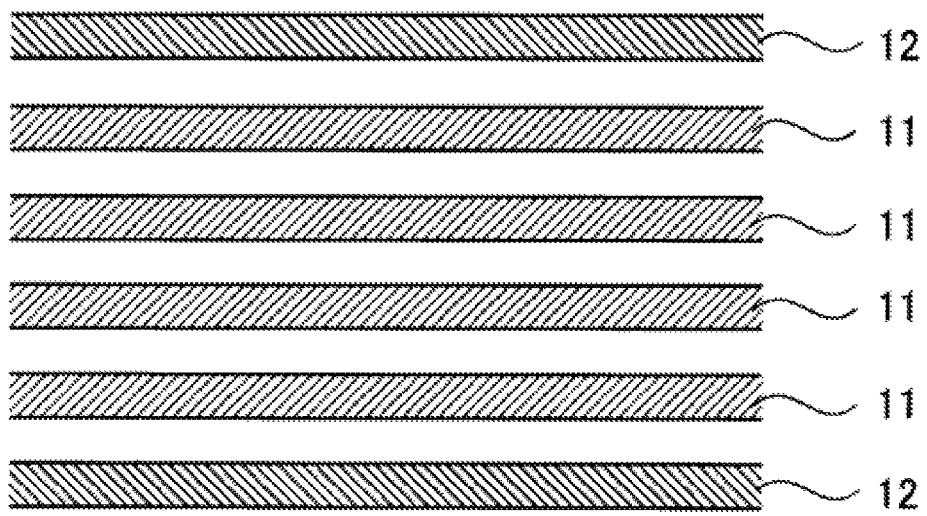
FIG. 2 is a cross-sectional view (a first cross-sectional view) illustrating a process of manufacturing the printed wiring board according to the first exemplary embodiment of the present disclosure.
Figure 3:
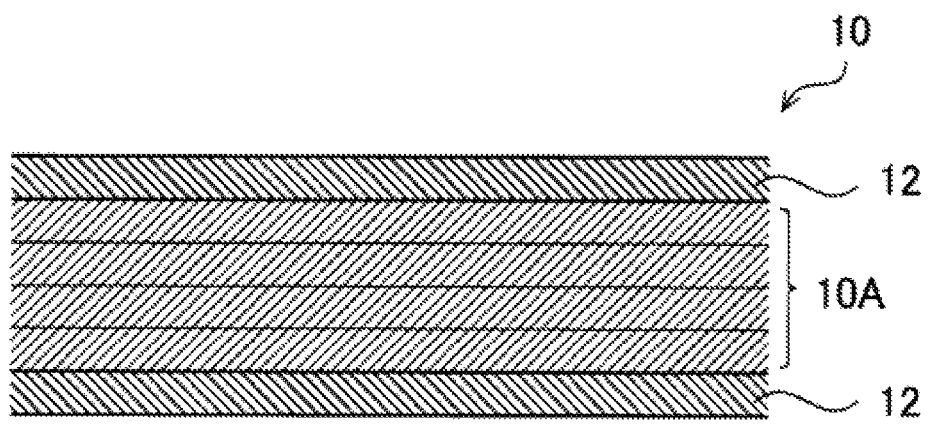
FIG. 3 is a cross-sectional view (a second cross-sectional view) illustrating the process of manufacturing the printed wiring board according to the first exemplary embodiment of the present disclosure.

FIGS. 2 and 3 are views illustrating a process of forming the core substrate 10. The core substrate 10 includes the conductive layer 10A that contains the CFRP as described above. As illustrated in FIGS. 2 and 3, the core substrate 10 is formed by stacking multiple sheets of a prepreg 11 obtained by impregnating the epoxy resin into the woven cloth of the carbon fiber, interposing the stacked prepreg 11 between the copper foils 12, and followed by heating and pressurization. As a result, the resin included in the prepreg 11 is hardened to form the conductive layer 10A. The copper foil 12 is subjected to a patterning process in a subsequent process to form the land 10B as illustrated in FIG. 1. The number of the stacked prepreg 11 included in the core substrate 10 may be arbitrarily selected. In the exemplary embodiment, the copper foil 12 formed on the surface of the core substrate 10 may be an example of a second conductive layer.

The carbon fiber used for the prepreg 11 has a low thermal expansion coefficient and a high elastic modulus. The thermal expansion coefficient of the carbon fiber is, for example, about zero (0) ppm/° C., and the thermal expansion coefficient of the prepreg 11 obtained by impregnating the resin into the carbon fiber is, for example, about several ppm/° C. The prepreg 11 may be compressed using, for example, a vacuum press method, a laminator including a vacuum laminator or a laminate press device. The resin impregnated in the carbon fiber is hardened by a heating and pressurizing treatment to form the conductive layer 10A. The copper foil 12 coated on the surface of the conductive layer 10A is provided, for example, for the purpose of protecting the surface of the core substrate 10 (the conductive layer 10A), and as a plating power feeding layer when plating is performed on the core substrate 10 (conductive layer 10A).

<Outer through hole forming process>Outer Through Hole Forming Process

Figure 4:
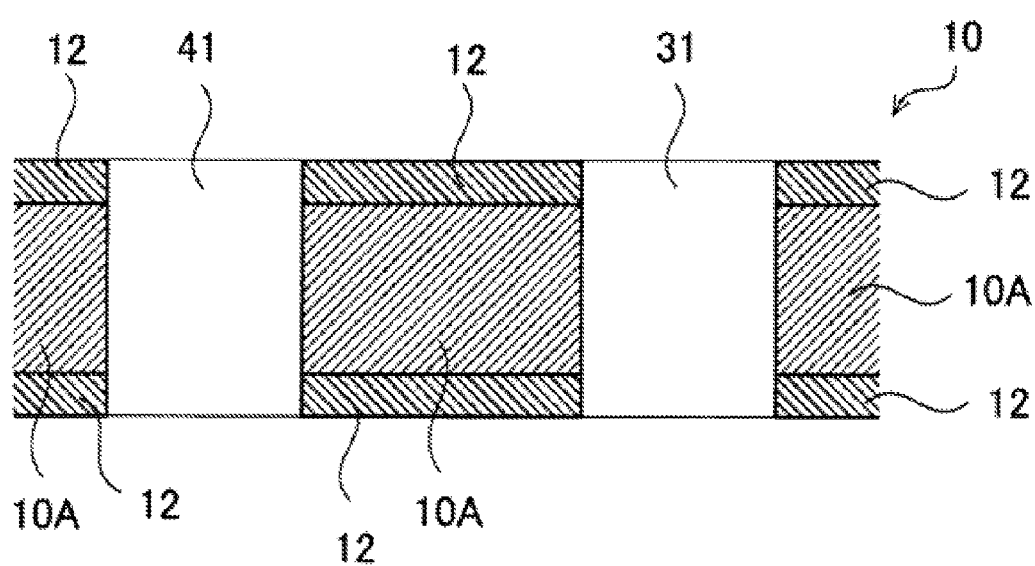
FIG. 4 is a cross-sectional view (a third cross-sectional view) illustrating the process of manufacturing the printed wiring board according to the first exemplary embodiment of the present disclosure of FIG. 3.

FIG. 4 illustrates a process of forming the outer through holes 31 and 41 of the penetrating-through hole vias that includes the core connecting via 30 and the core separating via 40 in the core substrate 10. The outer through hole 31 of the core connecting via 30 and the outer through hole 41 of the core separating via 40 are formed at predetermined positions of the core substrate 10. The outer through holes 31 and 41 may be perforated by, for example, a cutting processing using a drill, a punching processing using a punching mold or an ablation processing using laser. The diameters of the outer through holes 31 and 41 may be determined according to the diameters of the aforementioned inner through holes 32 and 42 such that an electrical short does not occur between the conductive films 31A and 32A and the conductive films 41A and 42A, and yield may be improved. For example, when the diameter of the inner through holes 32 and 42 is about 0.25 mm as in a general case, the diameter of the outer through holes 31 and 41 may be determined to be about 0.7 mm.

Figure 5:
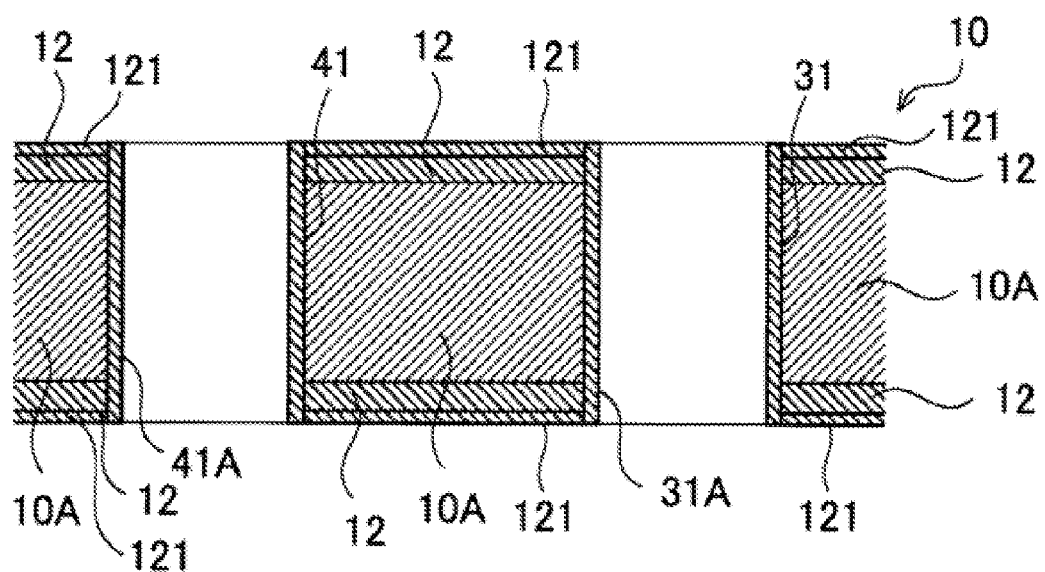
FIG. 5 is a cross-sectional view (a fourth cross-sectional view) illustrating the process of manufacturing the printed wiring board according to the first exemplary embodiment of the present disclosure.

<Plating process of the wall surface of the outer through hole>Plating Process of Wall Surface of Outer Through Hole FIG. 5 is a view illustrating a process of performing the plating on the inner wall surfaces of the outer through holes 31 and 41. In the exemplary embodiment, the inner wall surfaces of the outer through holes 31 and 41 are coated by a copper plating. As a result, the conductive films 31A and 41A are formed as illustrated in FIG. 1.

When the outer through holes 31 and 41 are formed in the core substrate 10, the inner wall surfaces of the outer through holes 31 and 41 may become uneven by, for example, an abrasion of a drill. As a result, fragments of the CFRP tend to be attached to the inner wall surfaces of the outer through holes 31 and 41 and remained. To cope with this, an electroless copper plating or an electrolytic copper plating is performed on the inner wall surfaces of the outer through holes 31 and 41. As a result, even if the fragments of the CFRP remain on the inner wall surfaces of the outer through holes 31 and 41, the electrical short between the conductive films 31A and 41A and the conductive films 32A and 42A may be suppressed. In the present process, a plated copper is precipitated using the copper foil 12 as a cathode of the electroplating of the plating process. Among reference numerals, the reference numeral 121 denotes the conductive film formed by the plated copper precipitated on the surface of the copper foil 12.

When the inner wall surfaces of the outer through holes 31 and 41 are coated by the conductive films 31A and 41A, the inner wall surfaces becomes smooth, so that it becomes easy to fill the outer through holes 31 and 41 with the insulation resin in a subsequent process. By doing this, the voids (bubbles) are rarely generated in the insulation resin, so that the electrical short between the conductive layer 10A of the core substrate 10 and the conductive film 32A coated on the inner wall surface of the inner through hole 32 may be suppressed. The thickness of the plated copper that forms the conductive films 31A and 41A may be set to a predetermined thickness, and may be set to be about 0.025 mm in which a reliability is considered to be high.

<Process of filling the insulation resin>Process of Filling Insulation Resin

Figure 6:
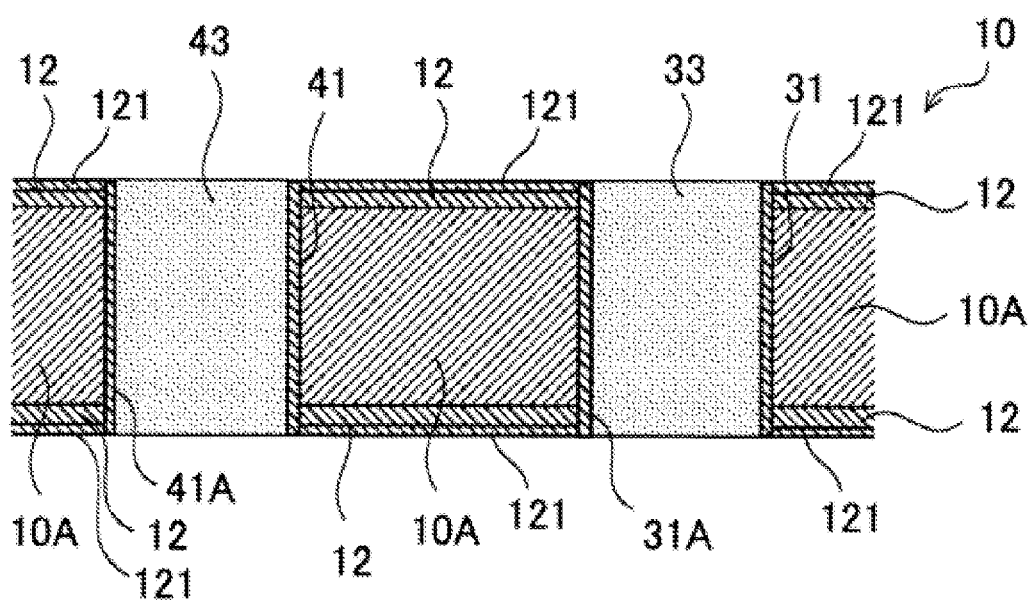
FIG. 6 is a cross-sectional view (a fifth cross-sectional view) illustrating the process of manufacturing the printed wiring board according to the first exemplary embodiment of the present disclosure.

FIG. 6 is a view illustrating a process of filling the outer through holes 31 and 41 with the insulation resin. After the conductive films 31A and 41A are formed by coating the inner wall surfaces of the outer through holes 31 and 41 with the copper plating, the outer through holes 31 and 41 are filled with an insulation resin. As for the insulation resin filled in the outer through holes 31 and 41, for example, a thermosetting resin hardened by heating may be used. The insulation resin parts 33 and 43 are formed by the insulation resin filled in the outer through holes 31 and 41. An inorganic filler, such as silica powder having a low thermal expansion coefficient may be added to the insulation resin filled in the outer through holes 31 and 41. As a result, the insulation resin contributes to decrease the thermal expansion coefficient of the core substrate 10, so that it is easy to reduce the generation of distortion resulting from a thermal stress. For portions protruding from the outer through holes 31 and 41 after the insulation resin filled in the outer through holes 31 and 41 is hardened, the surface of the insulation resin may be planarized by a planarization processing, such as, for example, a grinding processing.

<Electroless Copper Plating Process/Resist Film Forming Process

Figure 7:
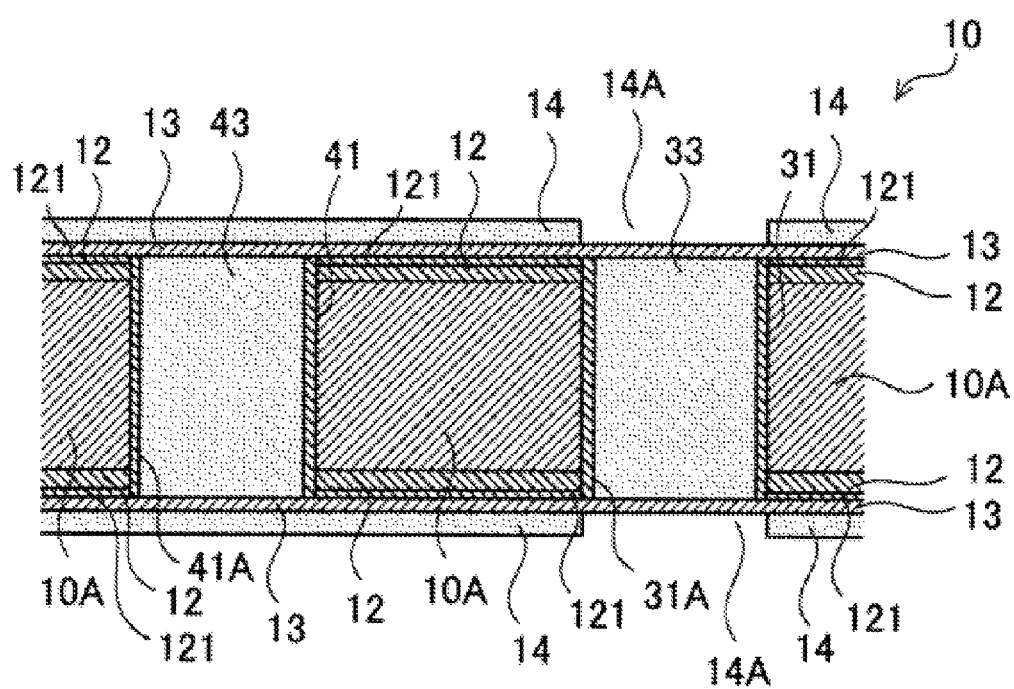
FIG. 7 is a cross-sectional view (a sixth cross-sectional view) illustrating the process of manufacturing the printed wiring board according to the first exemplary embodiment of the present disclosure.

FIG. 7 illustrates an electroless copper plating process and a resist film forming process. After forming the insulation resin parts 33 and 43 on the outer through holes 31 and 41, the electroless copper plating is performed on both surfaces of the core substrate 10 to form an electroless copper-plated layer 13.

Subsequently, a resist film 14 is formed for a photolithography process on the surface of the electroless copper-plated layer 13 formed on both surfaces of the core substrate 10. Then, the resist film 14 is subjected to a patterning process by performing an exposure process and a development process on the resist film 14. By doing this, an opening 14A is formed on the portion of the resist film 14 at which the core connecting via 30 is formed on the surface of the core substrate 10. That is, the resist film 14 is subjected to a patterning process so that the opening 14A overlaps the surface portion of the insulation resin filled in the outer through hole 31 in the plane direction of the core substrate 10.

<Electrolytic Copper Plating Process

Figure 8:
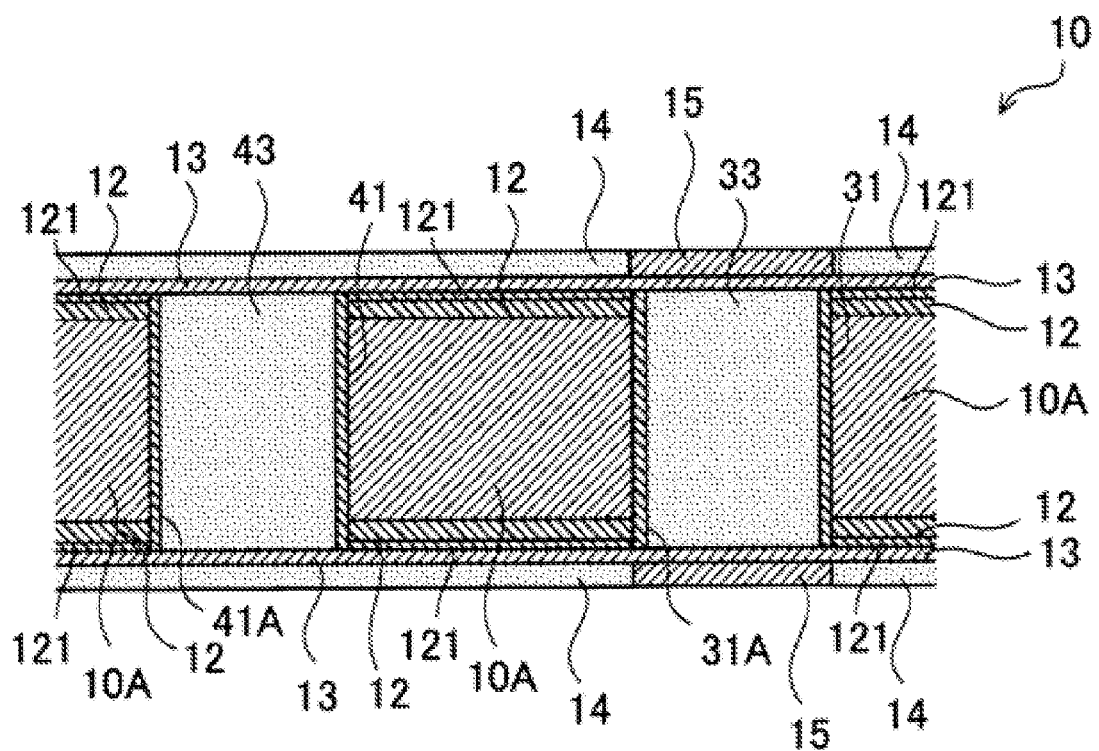
FIG. 8 is a cross-sectional view (a seventh cross-sectional view) illustrating the process of manufacturing the printed wiring board according to the first exemplary embodiment of the present disclosure.

FIG. 8 is a view illustrating a process of performing the electrolytic copper plating on both surfaces of the core substrate 10. In the present process, the electrolytic copper plating is performed on both surfaces of the core substrate 10 using the electroless copper-plated layer 13 formed on both surfaces of the core substrate 10 in the aforementioned electroless copper plating process as the power feeding layer, and using the resist film 14 as a mask. Accordingly, an electrolytic copper-plated layer 15 is formed on the portion at which the opening 14A of the resist film 14 is formed. The electrolytic copper-plated layer 15 finally forms the lid plating part 10C as illustrated in FIG. 1. The electrolytic copper-plated layer 15 is an example of a first conductive layer.

After the electrolytic copper-plated layer 15 is formed on both surfaces of the core substrate 10, the resist film 14 is removed. The thickness of the electrolytic copper-plated layer 15 is not limited to a specific value, but may be set to, for example, about 20 μm to 25 μm.

<Land Forming Process

Figure 9:
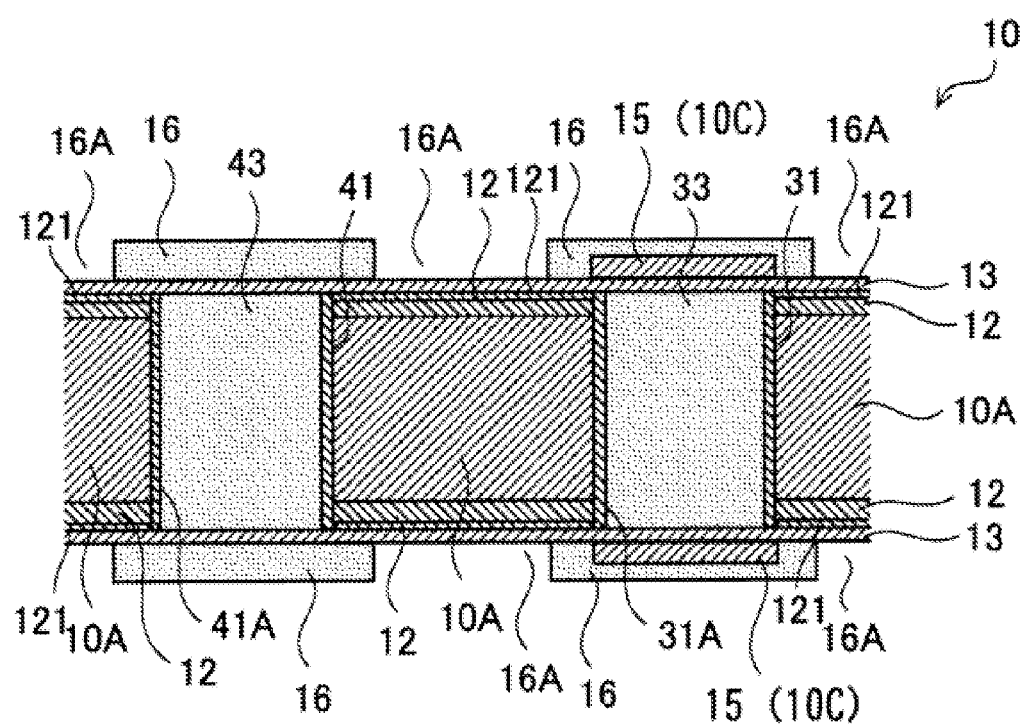
FIG. 9 is a cross-sectional view (an eighth cross-sectional view) illustrating the process of manufacturing the printed wiring board according to the first exemplary embodiment of the present disclosure.
Figure 11:
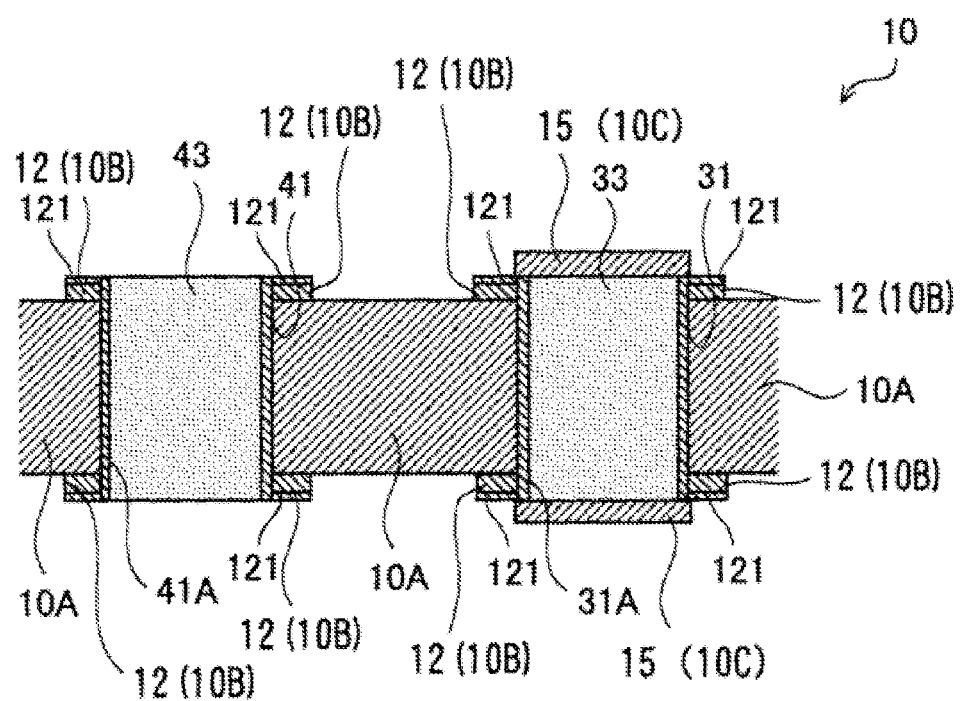
FIG. 11 is a cross-sectional view (a tenth cross-sectional view) illustrating the process of manufacturing the printed wiring board according to the first exemplary embodiment of the present disclosure.

FIGS. 9 to 11 are views illustrating a process of forming the land 10B on both surfaces of the core substrate 10. FIG. 9 illustrates a state in which a resist film 16 is formed on both surfaces of the core substrate 10. The resist film 16 is subjected to a patterning process by performing an exposure process and a development process on the resist film 16 coated on the entire surfaces of the core substrate 10. At this time, the resist film 16 is subjected to the patterning process so that the land 10B as illustrated in FIG. 1 is formed around the outer through hole 31 (the insulation resin part 33) and the outer through hole 41 (insulation resin part 43) in a subsequent etching process. Particularly, the opening 16A is patterned on the resist film 16 so that the land 10B of an adjacent penetrating-through hole via is disposed while being electrically separating from each other. Here, in the outer through hole 31, the electrolytic copper-plated layer 15 is formed on both surfaces of the insulation resin part 33. Accordingly, it may be expressed that the land 10B formed around the outer through hole 31 is formed around the electrolytic copper-plated layer 15.

FIG. 10 illustrates a state in which an etching process is performed using the resist film 16 as a mask. The electroless copper-plated layer 13, the conductive film 121, and the copper foil 12 in the portion corresponding to the opening 16A are removed by performing an etching process using the resist films 16 as a mask. FIG. 11 illustrates a state in which the resist film 16 is removed. The resist film 16 is continuously removed after performing the etching process. Also, the etching process is performed on the entire both surfaces of the core substrate 10 to remove the electroless copper-plated layer 13. Through the processes as illustrated in FIGS. 9 and 10, the land 10B may be separately formed around the electrolytic copper-plated layer 15 of the outer through hole 31 and around the outer through hole 41. The land 10B is formed to include the copper foil 12 and the conductive film 121 on the surface of the copper foil 12.

In the exemplary embodiment, the electroless copper-plated layer 13 formed on the surface of the core substrate 10 in the electroless copper plating process may be used for the purpose as described below, as well as being used as the power feeding layer when the electrolytic copper-plated layer 15 is formed in the electrolytic copper plating process. That is, by forming the electroless copper-plated layer 13 on the surface of the core substrate 10, it becomes easy to detach the resist film 16 after the etching process. For example, when the electroless copper-plated layer 13 is not formed on the surfaces of the insulation resin parts 33 and 43 of the outer through holes 31 and 41, the resist film 16 is directly formed on the insulation resin parts 33 and 43. Thus, the organic resins are coupled to each other, so that it is difficult to detach the resist film 16 from the insulation resin parts 33 and 32. In contrast, when the electroless copper-plated layers 13 are formed on the surfaces of the insulation resin parts 33 and 43, the resist film 16 may be easily detached at the time of removing the resist film 16.

<Wiring Layer Forming Process>

Figure 12:
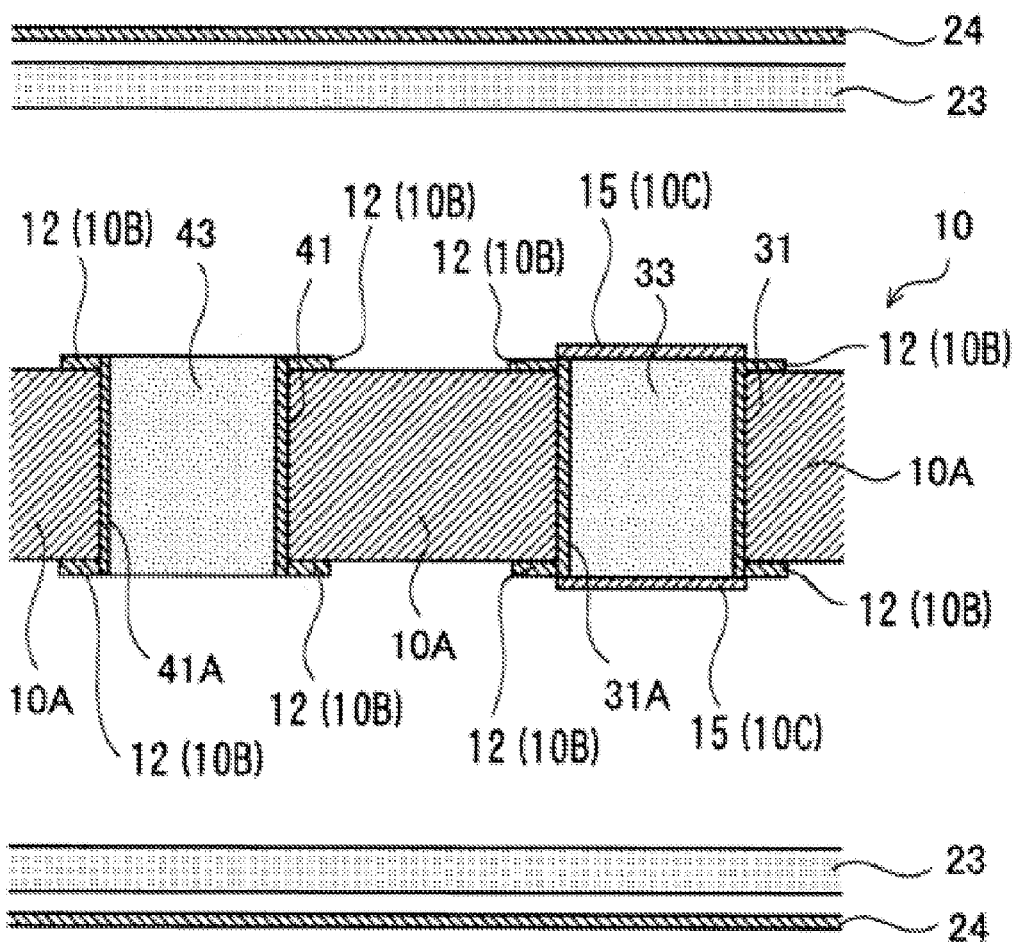
FIG. 12 is a cross-sectional view (an eleventh cross-sectional view) illustrating the process of manufacturing the printed wiring board according to the first exemplary embodiment of the present disclosure.
Figure 13:
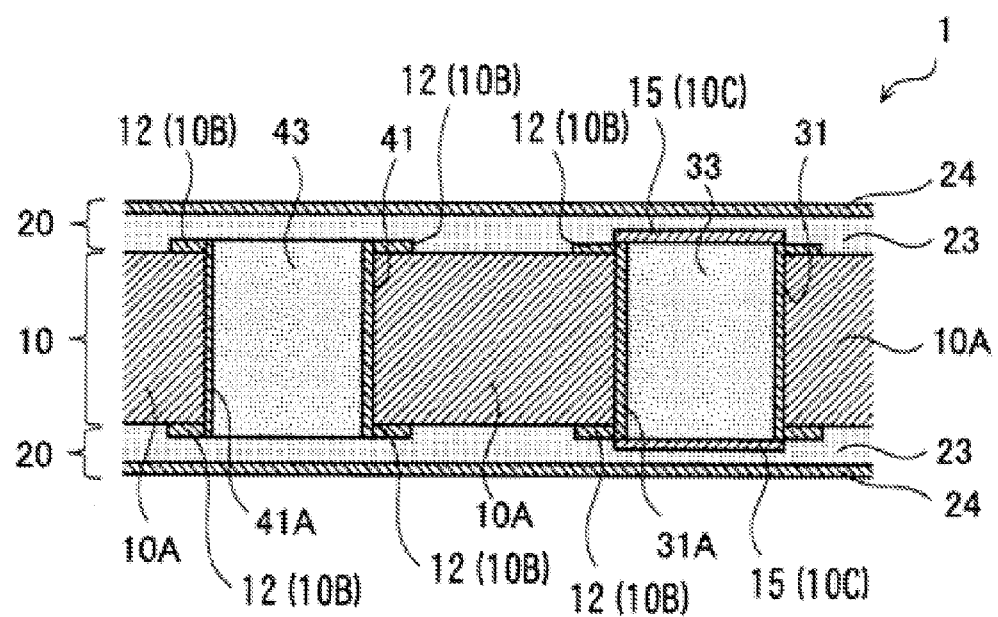
FIG. 13 is a cross-sectional view (a twelfth cross-sectional view) illustrating the process of manufacturing the printed wiring board according to the first exemplary embodiment of the present disclosure.

FIGS. 12 and 13 are views illustrating a process of forming the wiring layer 20. As illustrated in FIG. 12, the prepreg 23 and the copper foil 24 are prepared so as to interpose both surfaces of the core substrate 10. The prepreg 23 is obtained, for example, by impregnating the resin material such as the epoxy resin into the glass fiber cloth. The prepreg 23 and the copper foil 24 are sequentially laminated on both surfaces of the core substrate 10. Then, the core substrate 10 is interposed between two sets of the prepreg 23 and the copper foil 24, heated and pressurized to harden the prepreg 23. As a result, the prepreg 23, the copper foil 24 and the core substrate 10 are integrally formed as illustrated in FIG. 13. The prepreg 23 is formed as the insulation layer 20A and the copper foil 24 is formed as the conductive pattern layer 20B as illustrated in FIG. 1. The conductive film 121 formed on the surface of the copper foil 12 is not illustrated in FIG. 12 and subsequent drawings thereof.

<Inner Through Hole Forming Process

Figure 14:
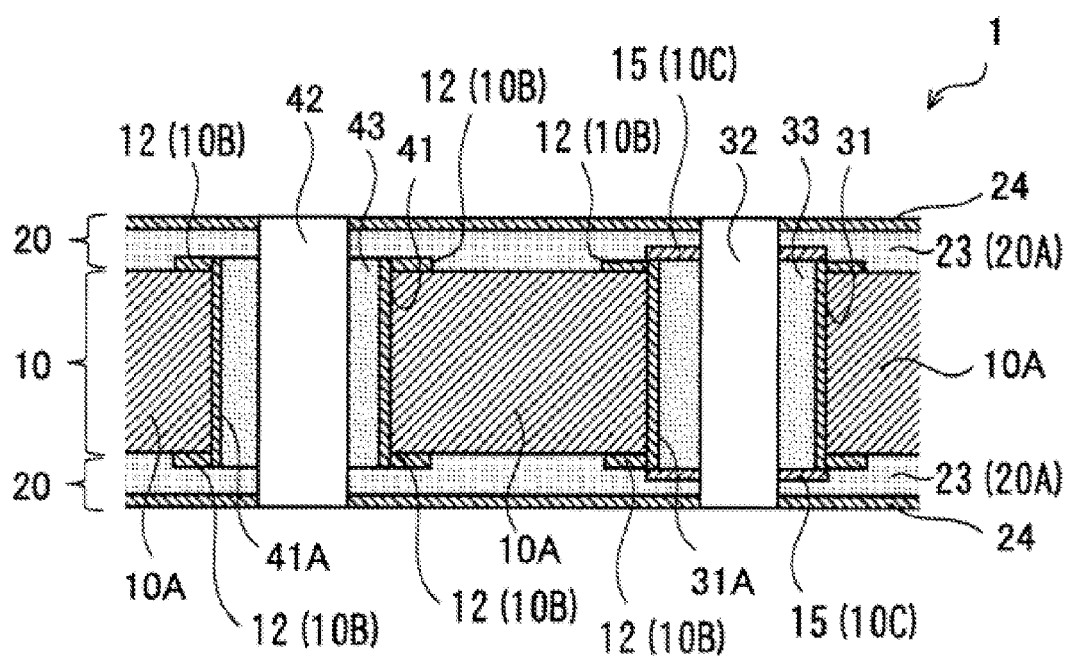
FIG. 14 is a cross-sectional view (a thirteenth cross-sectional view) illustrating the process of manufacturing the printed wiring board according to the first exemplary embodiment of the present disclosure.

FIG. 14 illustrates a process of forming the inner through holes 32 and 42. As illustrated in FIG. 14, the inner through holes 32 and 42 are formed so as to pass through the core substrate 10 and the one set of the wiring layers 20 laminated on both surfaces of the core substrate 10 in the thickness direction of the core substrate 10. The inner through holes 32 and 42 may be perforated by, for example, a cutting processing using a drill, a punching processing using a punching mold or an ablation processing using laser.

<Plating Process Of Wall Surface Of Inner Through Hole

Figure 15:
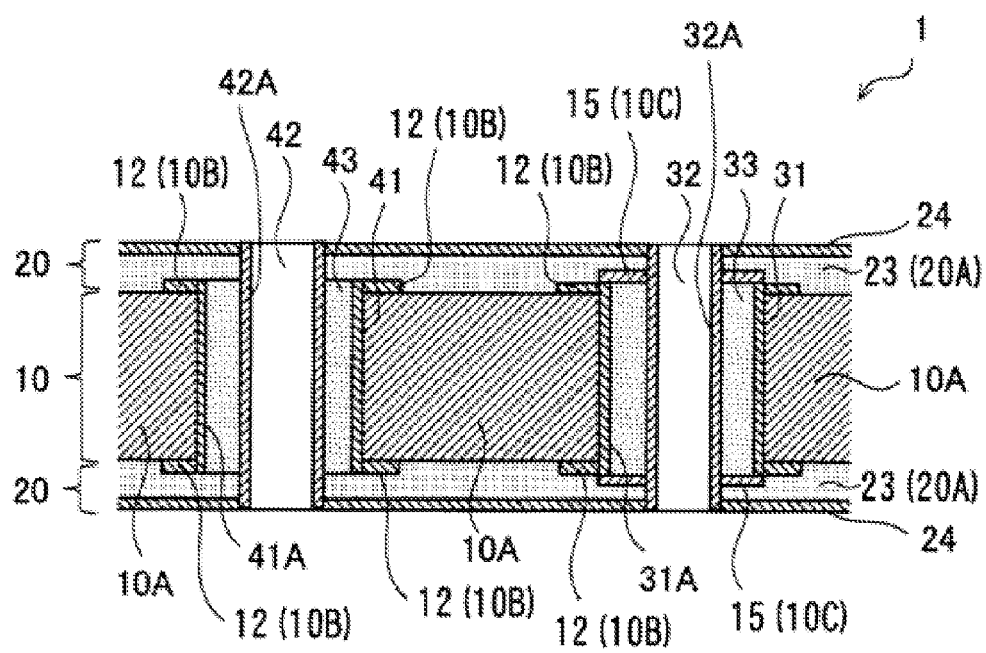
FIG. 15 is a cross-sectional view (a fourteenth cross-sectional view) illustrating the process of manufacturing the printed wiring board according to the first exemplary embodiment of the present disclosure.

FIG. 15 is a view illustrating a process of performing a plating process on the inner wall surfaces of the inner through holes 32 and 42. In the exemplary embodiment, the inner wall surfaces of the inner through holes 32 and 42 are coated by a copper plating, thereby forming the conductive films 32A and 42A as illustrated in FIG. 1. Here, the plated copper is precipitated using the copper foil 12 as a cathode of the electroplating in the plating processing as illustrated in FIG. 15. In the present plating process, similar to the conductive film 121 as illustrated in FIG. 5, the conductive film is actually formed on the surface of the copper foil 24, as well as the inner wall surfaces of the inner through holes 32 and 42, but the illustration thereof is omitted for convenience sake.

<Conductive Pattern Layer Forming Process

Figure 16:
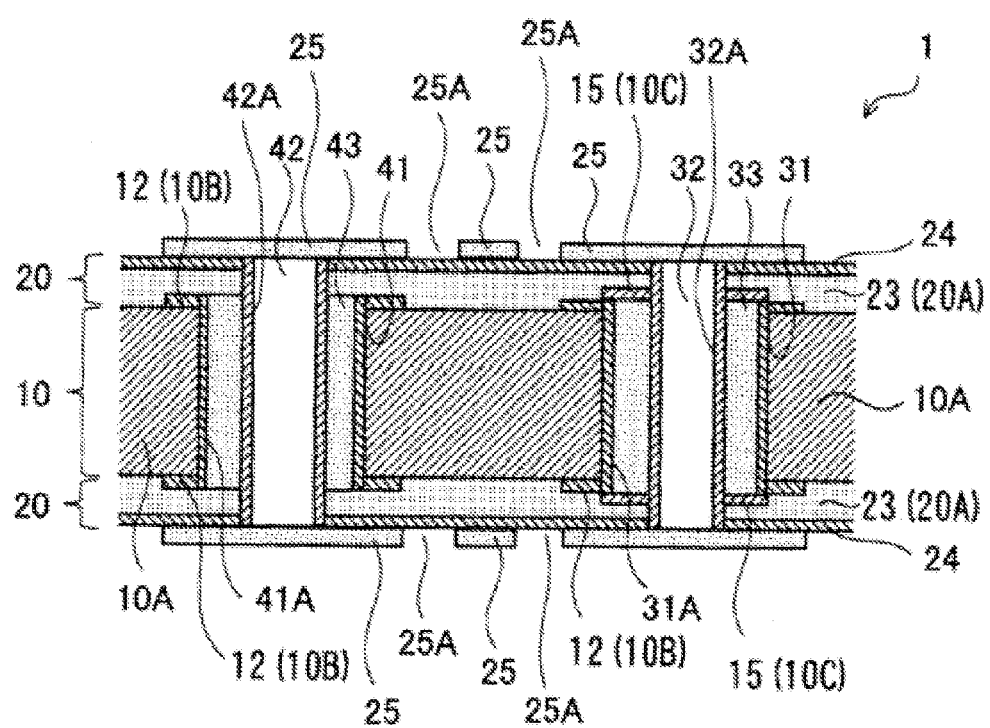
FIG. 16 is a cross-sectional view (a fifteenth cross-sectional view) illustrating the process of manufacturing the printed wiring board according to the first exemplary embodiment of the present disclosure.
Figure 17:
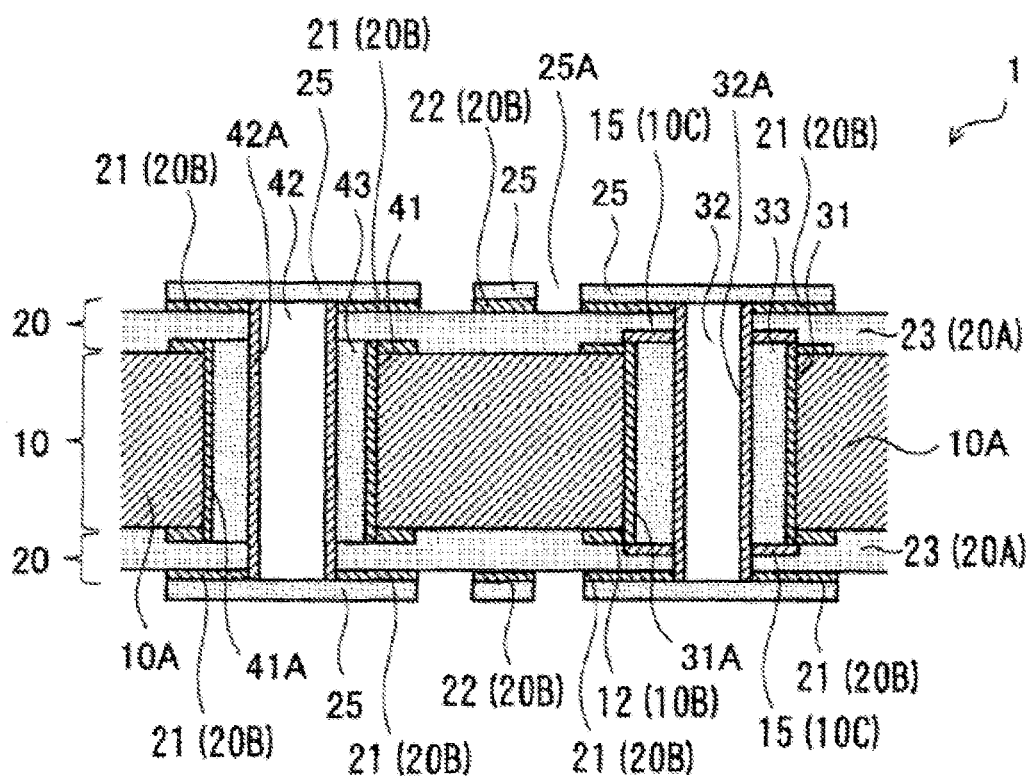
FIG. 17 is a cross-sectional view (a sixteenth cross-sectional view) illustrating the process of manufacturing the printed wiring board according to the first exemplary embodiment of the present disclosure.

FIGS. 16 and 17 are views illustrating a process of forming a conductive pattern layer. In the process as illustrated in FIG. 16, the resist film 25 is formed on the surface of the copper foil 24. The resist film 25 may be subjected to a patterning process so that the portion where the conductive pattern layer 20B as illustrated in FIG. 1 is formed becomes the opening 25A. Subsequently, as illustrated in FIG. 17, an etching process is performed using the resist film 25 as a mask. Accordingly, the copper foil 24 at the position where the opening 25A of the resist film 25 is formed is removed. After the etching process, the conductive pattern layer 20B that includes the land 21 and the wiring pattern 22 is formed including the remaining copper foil 24 and the conductive film formed on the surface of copper foil 24.

The printed wiring board 1 as illustrated in FIG. 1 may be manufactured through the respective processes as described above. In the aforementioned process of forming the resist film 14, the resist film 14 may be patterned so that the ends of the land 10B and the lid plating part 10C of the printed wiring board 1 overlap vertically. As a result, the electrical conduction between the land 10B and the lid plating part 10C is improved.

In this case, a lap width in which the land 10B and the cover plating part 10C overlap in a plane direction may be set to have a predetermined numerical value. For example, in the process of forming the resist film 14, the diameter of the opening 14A of the resist film 14 may be larger than that of the outer through hole 31, and thus the entire surfaces of the insulation resin filled in the outer through hole 31 may be exposed through the opening 14A. The lap width of the land 10B and the lid plating part 10C may be adjusted to have a desired numerical value by adjusting the difference of the diameters of the opening 14A and the outer through hole 31. In the exemplary embodiment, the copper plating is performed on the inside of the outer through hole 31. Accordingly, the opening 14A of the resist film 14 and the outer through hole 31 may be formed to have the same diameter, and thus, the resist film 14 may be patterned so that the outlines of the opening 14A of the resist film 14 and the outer through hole 31 may vertically overlap. Even in this case, an electrical conduction between the small-sized opening end of the conductive film 31A and the lid coating part 10C may be achieved. As a result, a good electrical connection may be achieved between the land 10B, the conductive film 31A, the lid coating part 10C and the conductive film 32A.

As described above, in the method of manufacturing the printed wiring board 1 according to the exemplary embodiment, for the core connecting via 30, the copper foil 12 is formed on the surface of the core substrate 10 before forming the outer through hole 31. Then, the electrolytic copper-plated layer 15 is formed at the portion where the core connecting via 30 is formed using the resist film 14 patterned with the opening 14A as a mask. Then, the etching process is performed using the resist film 16 formed at the portion where the electrolytic copper-plated layer 15 and the land 21 formed on the core substrate 10 are formed as a mask to form the inner through hole 32 that penetrates through the core substrate 10 and the wiring layer 20. According to the method of manufacturing the printed wiring board 1 as described above, the lid plating part 10C and the land 21 may be easily formed around the inner through hole 32 of the core connecting via 30. As a result, the electrical connection of the core substrate 10 and the core connecting via 30 may be easily secured without performing a laser processing on the insulation layer 20A.

<Modified Modified Embodiments

Figure 18:
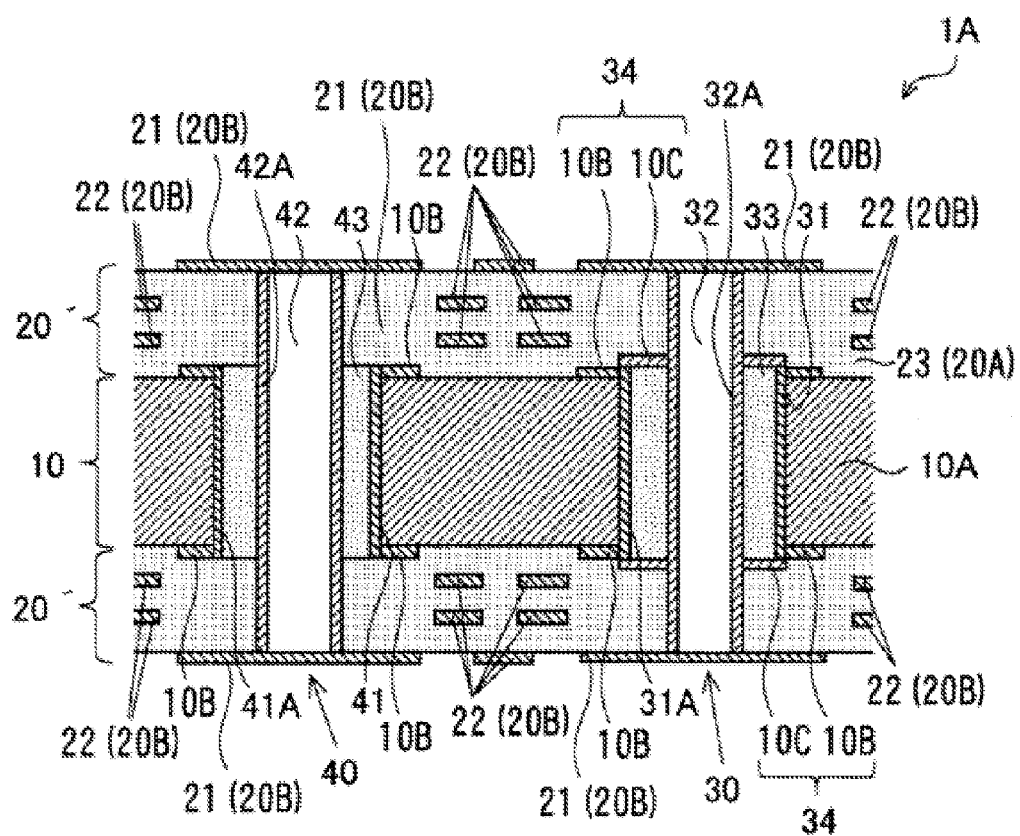
FIG. 18 is a cross-sectional view of a printed wiring board according to a first modified embodiment of the present disclosure.
Figure 19:
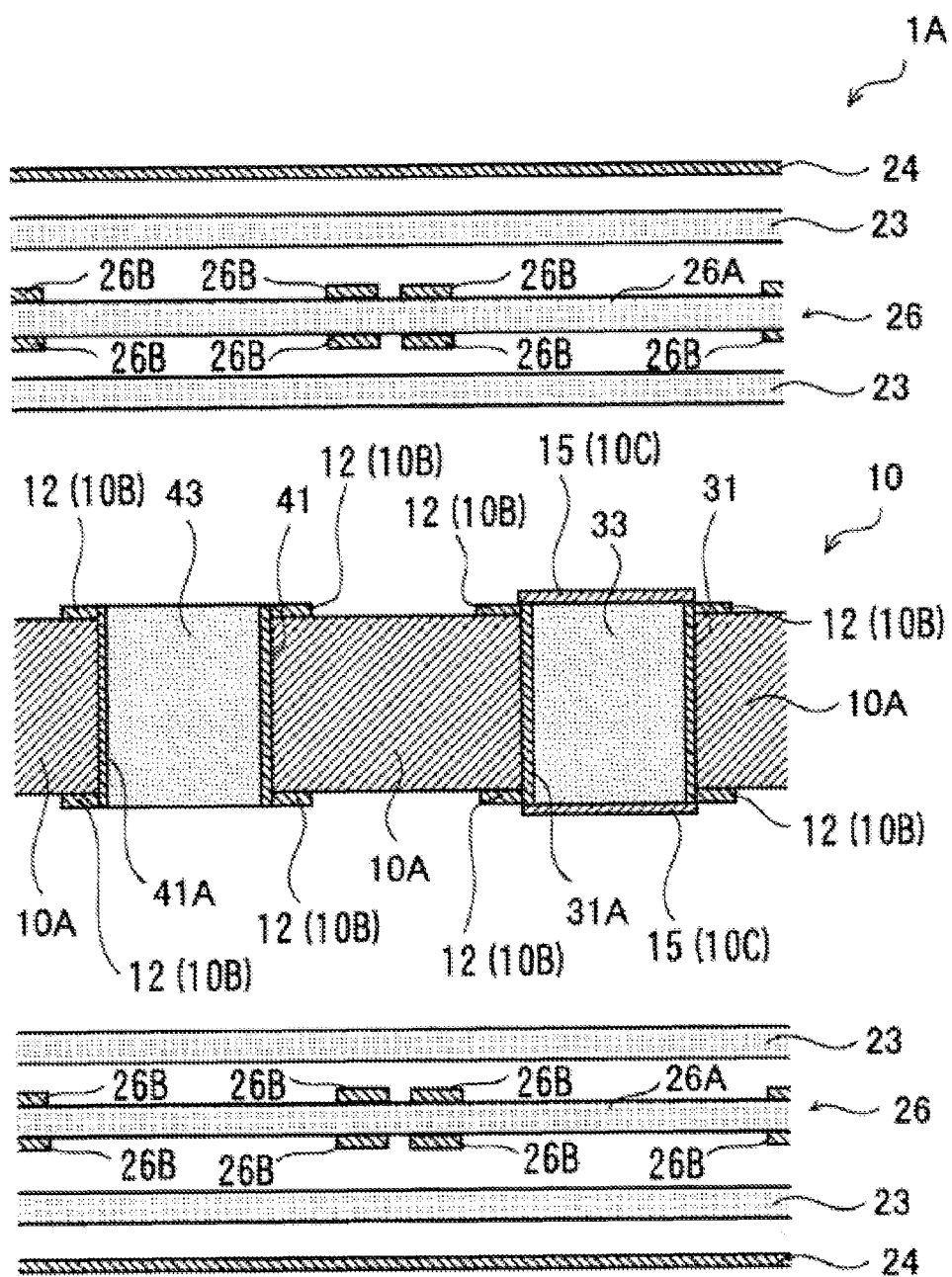
FIG. 19 is a view illustrating a process of forming a wiring layer according to the first modified embodiment of the present disclosure.

FIG. 18 is a cross-sectional view of a printed wiring board 1A according to a first modified embodiment. In the printed wiring board 1A as illustrated in FIG. 18, a plurality of the conductive pattern layers 20B and a plurality of the insulation layers 20A are alternately laminated to form a wiring layer 20'. FIG. 19 is a view illustrating a process of forming the wiring layer 20' according to the first modified embodiment. The core substrate 10 is the same as that of the first exemplary embodiment.

As illustrated in FIG. 19, in forming the wiring layer 20', the prepreg 23, a wiring sheet 26, the prepreg 23 and the copper foil 24 are position-aligned on both surfaces of the core substrate 10, and then, heated and pressurized to integrally form the wiring layer 20' with the core substrate 10. The wiring sheet 26 is formed, for example, by forming a wiring pattern 26B on both surfaces of an insulation resin sheet 226A. The wiring sheet 26 may be formed by etching a copper foil of a both-side copper attached substrate in which the copper foil is deposited on both surfaces of the insulation resin sheet including the glass fiber cloth in a predetermined pattern. After the core substrate 10 and the wiring layer 20' are integrally formed, the printed wiring board 1A as illustrated in FIG. 18 may be manufactured through respective processes after the process of forming the inner through hole as illustrated in FIG. 14.

Figure 20:
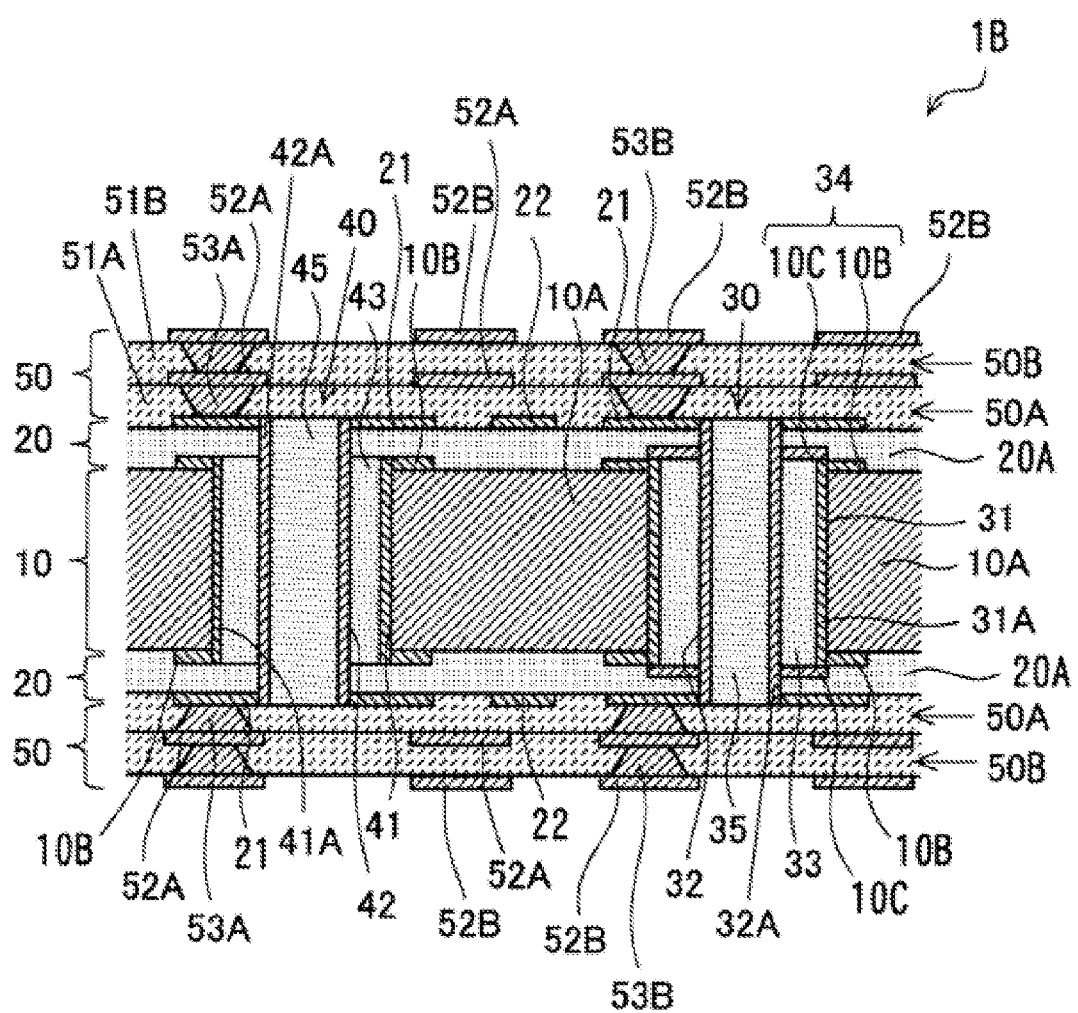
FIG. 20 is a cross-sectional view of a printed wiring board according to a second modified embodiment of the present disclosure.

In the printed wiring board 1 as illustrated in FIG. 1, for example, a build-up part may be laminated on the surface of the wiring layer 20. FIG. 20 is a cross-sectional view of a printed wiring board 1B according to a second modified embodiment. The printed wiring board 1B includes a set of build-up parts 50 laminated on the surface of each wiring layer 20. The build-up part 50 is formed by laminating an insulation layer, a wiring pattern and a wiring layer that includes a via. In the example as illustrated in FIG. 20, the build-up part 50 has two build-up layers 50A and 50B, but the number of laminated build-up layers may be set to an arbitrary number. When the build-up part 50 is laminated on the wiring layer 20 as in the present modified embodiment, the insulation resin parts 35 and 45 are formed in an inside of the inner through holes 32 and 42. An insulation resin that forms the insulation resin parts 35 and 45 is not limited to a specific type, but the insulation resin parts 35 and 45 may be formed of, for example, the same type of resin as the insulation resin parts 33 and 43.

The first build-up layer 50A includes an insulation layer 51A, a wiring pattern 52A and a via 53A electrically connected with the land 21 of the wiring layer 20. The second build-up layer 50B includes an insulation layer 51B, a wiring pattern 52B and a via 53B. The wiring patterns 52A and 52B in the respective build-up layers are electrically connected through each core connecting via 30 and the vias 53A and 53B.

The build-up part 50 may be formed, for example, by a build-up method. For example, the insulation layer 51A is formed by laminating an insulation resin film, such as an epoxy film, on both surfaces of the wiring layer 20, and a via hole that forms the via 53A is formed by a laser processing. In this case, the via hole is opened in the insulation layer 51A so that the land 21 formed on the topmost layer of the wiring layer 20 is exposed to a bottom surface. Next, an electroless copper-plated layer is formed on an inner surface of the via hole and a surface of the insulation layer 51A by a desmear processing. Subsequently, a resist film is deposited on the surface of the electroless copper-plated layer, and the resist film is subjected to a patterning process that includes an exposure process and a development process so that the portions at which the via 53A and the wiring pattern 52A are formed are exposed.

Next, an electrolytic copper plating is performed using the resist film formed on the surface of the electroless copper-plated layer as a mask and the electroless copper-plated layer as a plating power feeding layer. As a result, the electrolytically plated copper is formed on a portion where the electrolessly plated copper is exposed. The via hole is filled with the electrolytically plated copper to form the via 53A. Subsequently, the resist film is removed, and the electroless copper-plated layer exposed to the surface of the insulation layer 51A is removed by the etching process, so that the wiring pattern 52A is patterned. The second build-up layer 50B may be formed by similar processes as those of the first build-up layer 50A.

In the topmost build-up layer 50B, an electrode that connects a semiconductor device or a connection pad that bonds an external connection terminal is formed with a patterning process. The build-up layer 50B is coated by a solder resist layer (not illustrated) except for the electrode or the external connection terminal. A protective plating, such as a gold plating, may be performed on the electrode or on the external connection terminal exposed to the outside. In the modified embodiment, an example of forming the insulation layer 51A of the build-up part 50 using the insulation resin film has been described, but for example, a resin sheet in which a copper foil is attached to a surface thereof may be used. As described above, various variations may be applied to the method of manufacturing the printed wiring board according to the exemplary embodiment.

Second Exemplary Embodiment

Figure 21:
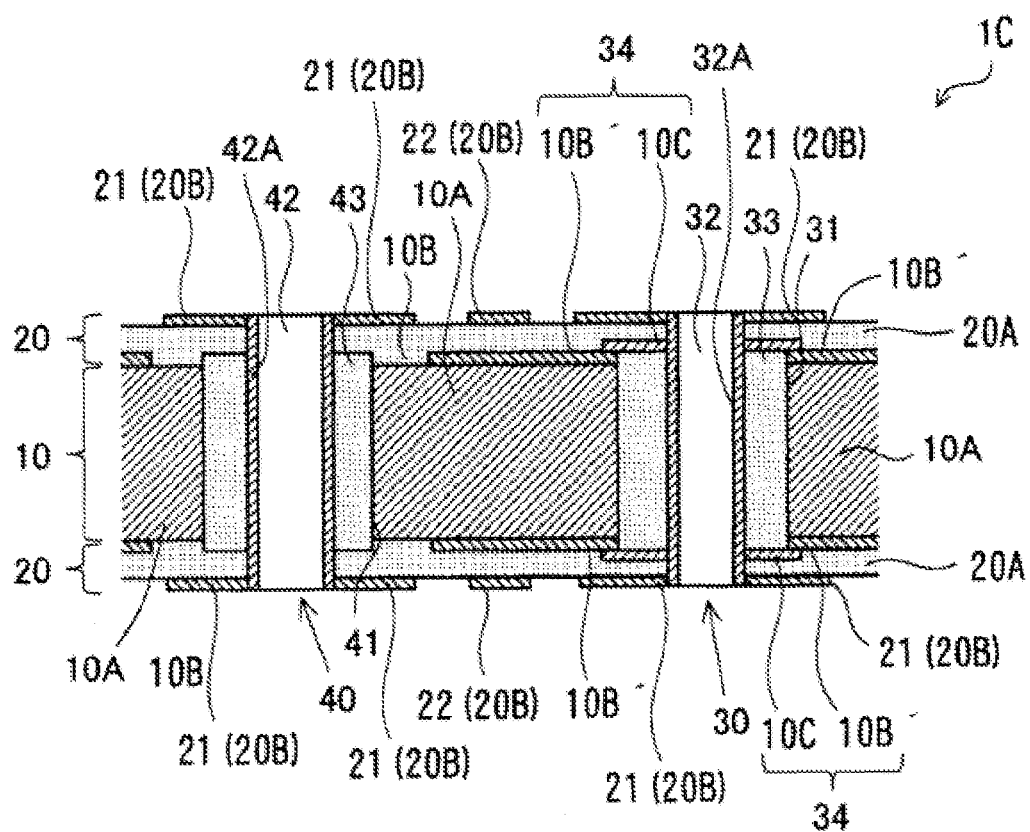
FIG. 21 is a cross-sectional view of a printed wiring board according to a second exemplary embodiment of the present disclosure.

A second exemplary embodiment of the present disclosure will be described. FIG. 21 is a cross-sectional view of a printed wiring board 1C according to the second exemplary embodiment. Common parts to those of the printed wiring board 1 of the first exemplary embodiment are denoted by the same reference numerals, so that detailed description thereof will be omitted. In the printed wiring board 1C, a process of performing the plating on the inner wall surfaces of the outer through holes 31 and 41 of the penetrating-through hole vias that includes the core connecting via 30 and the core separating via 40 is omitted.

In the printed wiring board 1C, a land 10B' is formed on a surface of the core substrate 10. The land 10B' is formed around the outer through hole 31 of the core connecting via 30, and connected to the surface of the core substrate 10 and the lid plating part 10C. The core connecting via 30 is a penetrating-through hole via electrically connected with the conductive layer 10A of the core substrate 10. As illustrated in FIG. 21, even when the plating process is not performed on the inner wall surface of the outer through hole 31, the electrical connection may be achieved between the carbon fiber exposed through an upper or lower surface of the conductive layer 10A and the land 10B'. In the meantime, the land 10B' is electrically connected with the conductive film 32A formed on an inner wall surface of the inner through hole 32 of the core connecting via 30 through the lid plating part 10C. Accordingly, even if the inner wall surface of the outer through hole 31 is not coated by the plating process, the conductive film 32A of the core connecting via 30 may be electrically connected with the conductive layer 10A of the core substrate 10 through the land 10B' and the lid plating part 10C.

However, since the carbon fiber included in the conductive layer 10A is oriented so as to spread and extend in a plane direction of the conductive layer 10A, the carbon fiber may be easily exposed irregularly from the surfaces (upper surface and lower surface) of the conductive layer 10A. Accordingly, when the land 10B' is connected to the carbon fiber exposed from the surface of the conductive layer 10A, it is difficult to achieve an electrical conduction compared to a case where the plating-connection is performed on the carbon fiber regularly exposed from the inner wall surface of the outer through hole 31. As a result, as illustrated in FIG. 21, the land 10B' of the printed wiring board 1C has an increased contact area with the surface of the conductive layer 10A compared to the land 10B of the first exemplary embodiment. Accordingly, the electrical conduction between the carbon fiber exposed from the surface of the conductive layer 10A and the land 10B' is easily achieved.

In the printed wiring board 1C, the end of the land 10B' and the lid plating part 10C are vertically overlapped with each other, so that the electrical conduction is easily achieved between the land 10B' and the lid plating part 10C. In this case, a lap width in which the land 10B' and the lid plating part 10C overlap may be set to have a predetermined numerical value. In manufacturing the printed wiring board 1C, as in the process of forming the resist film 14 described in the first exemplary embodiment, the diameter of the opening 14A of the resist film 14 may be made larger than that of the outer through hole 31 so that the outline of the outer through hole 31 may be included in the opening 14A. The lap width of the land 10B' and the lid plating part 10C may be adjusted to have a desired numerical value by adjusting the difference of the diameters of the opening 14A and the outer through hole 31.

When the surface of the land 10B' is formed to have a large area as in the printed wiring board 1C, it is difficult to exhaust the vapor generated by an evaporation of moisture contained in the resin material of the conductive layer 10A to the outside during the manufacturing. Accordingly, a gas exhausting hole for exhausting the vapor to the outside may be formed on the copper foil 24 covering the surface of the conductive layer 10A. The position, the size and the number of the gas exhausting hole may be freely set. As for the timing at which the vapor is generated from the resin material of the conductive layer 10A, a timing may be illustrated at which a heat treatment is performed in order to thermally harden the insulation resin filled in the outer through hole 31.

The Various alternations may be added to the exemplary embodiments and modified embodiments as described above without departing from the scope of the present disclosure. Also, the aforementioned exemplary embodiment and modified embodiments may be implemented through a combination thereof as much as possible.

For example, in the exemplary embodiments described above, the lid plating part 10C of the core connecting via 30 is formed on both surfaces of the core substrate 10. However, the lid plating part 10C may be provided on any one surface of the core substrate 10. In this case, the land 10B (10B') may be formed on at least the surface of a side where the lid plating part 10C is formed among the surfaces of the core substrate 10, so that the carbon fiber included in the core substrate 10 and the lid plating part 10C may be electrically connected. That is, when the lid plating part 10C is formed on the surface of at least one side of the core substrate 10, the conductive film 32A formed in the inner wall surface of the inner through hole 32 of the core connecting via 30 may be electrically connected with the conductive layer 10A through the land 10B (10B'). When the lid plating part 10C is formed on both surfaces of the core substrate 10, the electric resistance may be decreased compared to a case where the lid plating part 10C is formed on one surface of the core substrate 10.

Accordingly, in a wiring board including a core substrate having conductivity and a plurality of penetrating-through hole vias, the present disclosure provides a technology where it is not necessary to separately prepare a via in order to electrically connect the core connecting via with the core substrate, and the thermal stress generated in the wiring board may be reduced. The exemplary embodiments and modified embodiments will be further disclosed in Attachments below The structure of the core connected via described in Attachment 9 or 10, in which the core connecting conductive parts are formed on both surfaces of the core substrate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that the various changes, substitutions, and alterations could be made hereto without departing from the spirit and scope of the invention.

What is claimed is:

1. A method of manufacturing a wiring board including a core substrate having conductivity and a plurality of penetrating-through hole vias, the method comprising:
   forming an outer through hole that penetrates through the core substrate at a portion of the core substrate where a penetrating-through hole via is to be formed;
   filling the outer through hole with an insulation resin;
   forming a first conductive layer on a surface portion of the insulation resin where a core connecting via electrically connected with the core substrate is formed among the plurality of penetrating-through hole vias;
   forming a land around the first conductive layer;
   laminating a wiring layer over the core substrate after the forming of the first conductive layer and the forming of the land;
   forming an inner through hole that has a smaller diameter than that of the outer through hole and penetrates through the core substrate and the wiring layer so as to penetrate through the insulation resin; and
   coating a first conductive film on an inner wall surface of the inner through hole,
   wherein the core substrate and the first conductive film of the core connecting via are electrically connected through the first conductive layer and the land.

2. The method of claim 1, wherein in the forming of the first conductive layer, the first conductive layer is formed on a surface of the core substrate formed on a surface of the core substrate resist film patterned with an opening at a portion where the core connecting via is formed in the surface of the core substrate as a mask.

3. The method of claim 1, further comprising:
   forming a second conductive layer on the surface of the core substrate before the forming of the outer through hole,
   wherein in the forming of the land, a second resist film is formed at portions at which the first conductive layer and the land formed on the core substrate are formed, and an etching process is performed using the second resist film as a mask.

4. The method of claim 1, further comprising:
   coating a second conductive film on an inner wall surface of the outer through hole before the filling of the outer through hole with an insulation resin.

* * * * *